United States Patent
Jain et al.

(10) Patent No.: US 10,158,044 B2
(45) Date of Patent: *Dec. 18, 2018

(54) EPITAXY TECHNIQUE FOR GROWING SEMICONDUCTOR COMPOUNDS

(71) Applicant: Sensor Electronic Technology, Inc., Columbia, SC (US)

(72) Inventors: Rakesh Jain, Columbia, SC (US); Wenhong Sun, Lexington, SC (US); Jinwei Yang, Columbia, SC (US); Maxim S. Shatalov, Columbia, SC (US); Alexander Dobrinsky, Loudonville, NY (US); Remigijus Gaska, Columbia, SC (US); Michael Shur, Latham, NY (US)

(73) Assignee: Sensor Electronic Technology, Inc., Columbia, SC (US)

(*) Notice: Subject to any disclaimer, the term of this patent is extended or adjusted under 35 U.S.C. 154(b) by 0 days.

This patent is subject to a terminal disclaimer.

(21) Appl. No.: 15/391,922

(22) Filed: Dec. 28, 2016

(65) Prior Publication Data

US 2017/0104132 A1 Apr. 13, 2017

Related U.S. Application Data

(63) Continuation-in-part of application No. 13/692,191, filed on Dec. 3, 2012, now Pat. No. 9,831,382.

(Continued)

(51) Int. Cl.
*H01L 31/072* (2012.01)
*H01L 33/32* (2010.01)
(Continued)

(52) U.S. Cl.
CPC .......... *H01L 33/32* (2013.01); *H01L 21/0237* (2013.01); *H01L 21/0254* (2013.01);
(Continued)

(58) Field of Classification Search
CPC ........ H01L 33/0062–33/0079; H01L 33/0025; H01L 33/002; H01L 33/30–33/325;
(Continued)

(56) References Cited

U.S. PATENT DOCUMENTS 5,306,924 A 4/1994 Usami et al.
5,880,491 A * 3/1999 Soref ................ B82Y 20/00
257/18

(Continued)

FOREIGN PATENT DOCUMENTS

| CN | 101277563 A | 10/2008 |
|---|---|---|
| JP | 2010153450 | 8/2010 |
| KR | 100363241 | 2/2003 |
| KR | 1020100033644 | 3/2010 |
| KR | 1020100100567 | 9/2010 |

OTHER PUBLICATIONS

Allen, E., U.S. Appl. No. 13/756,806, Final Office Action 2, dated Jan. 4, 2017, 25 pages.

(Continued)

*Primary Examiner* — Kevin M Picardat
(74) *Attorney, Agent, or Firm* — LaBatt, LLC

(57) ABSTRACT

A solution for fabricating a semiconductor structure is provided. The semiconductor structure includes a plurality of semiconductor layers grown over a substrate using a set of epitaxial growth periods. During each epitaxial growth period, a first semiconductor layer having one of: a tensile stress or a compressive stress is grown followed by growth of a second semiconductor layer having the other of: the tensile stress or the compressive stress directly on the first semiconductor layer.

20 Claims, 15 Drawing Sheets

Related U.S. Application Data

(60) Provisional application No. 61/566,606, filed on Dec. 3, 2011.

(51) Int. Cl.

| | |
|---|---|
| *H01L 33/00* | (2010.01) |
| *H01L 33/12* | (2010.01) |
| *H01L 33/06* | (2010.01) |
| *H01L 21/02* | (2006.01) |
| *H01L 29/15* | (2006.01) |
| *H01L 33/02* | (2010.01) |
| *H01L 33/04* | (2010.01) |
| *H01L 33/20* | (2010.01) |

(52) U.S. Cl.
CPC .... *H01L 21/0262* (2013.01); *H01L 21/02458* (2013.01); *H01L 21/02507* (2013.01); *H01L 29/151* (2013.01); *H01L 33/0075* (2013.01); *H01L 33/06* (2013.01); *H01L 33/12* (2013.01); *H01L 33/007* (2013.01); *H01L 33/025* (2013.01); *H01L 33/04* (2013.01); *H01L 33/20* (2013.01)

(58) Field of Classification Search
CPC ............. H01L 33/0008; H01L 33/0016; H01L 33/0012; H01L 33/12
USPC ........................................................ 257/190
See application file for complete search history.

(56) References Cited

U.S. PATENT DOCUMENTS

| | | | |
|---|---|---|---|
| 6,472,695 | B1 | 10/2002 | Hall et al. |
| 6,518,644 | B2 | 2/2003 | Firzgerald |
| 7,081,410 | B2 | 7/2006 | Firzgerald |
| 7,312,474 | B2 | 12/2007 | Emerson et al. |
| 7,811,847 | B2 | 10/2010 | Hirayama et al. |
| 7,888,154 | B2 | 2/2011 | Hirayama et al. |
| 8,236,672 | B2 | 8/2012 | Chinone et al. |
| 9,831,382 | B2 * | 11/2017 | Jain .................... H01L 21/0237 |
| 2001/0024871 | A1 | 9/2001 | Yagi |
| 2002/0005514 | A1 | 1/2002 | Fitzgerald |
| 2002/0020850 | A1 | 2/2002 | Shibata et al. |
| 2002/0079502 | A1 | 6/2002 | Ishibashi et al. |
| 2004/0219702 | A1 | 11/2004 | Nagai et al. |
| 2005/0045895 | A1 | 3/2005 | Emerson et al. |
| 2005/0045905 | A1 | 3/2005 | Chu et al. |
| 2006/0160345 | A1 | 7/2006 | Liu et al. |
| 2007/0231488 | A1 | 10/2007 | Von Kaenel |
| 2008/0153191 | A1 | 6/2008 | Grillot et al. |
| 2008/0274268 | A1 | 11/2008 | Ogino |
| 2009/0057646 | A1 | 3/2009 | Hirayama et al. |
| 2009/0200645 | A1 | 8/2009 | Kokawa et al. |
| 2009/0239357 | A1 | 9/2009 | Amano et al. |
| 2010/0230713 | A1 | 9/2010 | Minemoto et al. |
| 2010/0244087 | A1 | 9/2010 | Horie et al. |
| 2010/0252834 | A1 * | 10/2010 | Lee .................... H01L 21/0242 257/76 |
| 2010/0252835 | A1 | 10/2010 | Horie et al. |
| 2010/0264460 | A1 | 10/2010 | Grandusky et al. |
| 2011/0037097 | A1 | 2/2011 | Scott et al. |
| 2011/0177678 | A1 | 7/2011 | Ohno et al. |
| 2011/0266520 | A1 | 11/2011 | Shur et al. |
| 2013/0193480 | A1 | 8/2013 | Sun et al. |

OTHER PUBLICATIONS

Jinzhu, C., Application No. 201380013532.2, Office Action2—English translation, dated Dec. 2, 2016, 15 pages.
Acord et al., In situ stress measurements during MOCVD growth of AlGaN on SiC, Journal of Crystal Growth, 2004, pp. 65-71, Elsevier B.V.
Akasheh et al., "Multiscale Modeling and Simulation of Deformation in Nanoscale Metallic Multilayered Composites," Chapter 6 of Kwon et al., "Multiscale Modeling and Simulation of Composite Materials and Structures," Spring, New York, 2008.
Bai et al., Reduction of threading dislocation densities in AlN/sapphire epilayers driven by growth mode modification, Applied Physics Letters, 2006, pp. 051903-1-051903-3, American Institute of Physics.
Dimitrakopulos et al., Strain accommodation and interfacial structure of AlN interlayers in GaN, Cryst. Res. Technol., 2009, pp. 1170-1180, No. 10, Wiley-VCH Verlag GmbH & Co. KGaA, Weinheim.
Dridi et al., First-principles investigation of lattice constants and bowing parameters in wurtzite AlxGa1-xN, InxGa1-xN and InxAl1-xN alloys, Semiconductor Science and Technology, 2003, pp. 850-856, Institute of Physics Publishing.
Figge et al., In situ and ex situ evaluation of the film coalescence for GaN growth on GaN nucleation layers, Journal of Crystal Growth, 2000, pp. 262-266, Elsevier Science B.V.
Haeberlen et al., Dislocation reduction in MOVPE grown GaN layers on (111)Si using SiNx and AlGaN layers, Journal of Physics: Conference Series 209, 2010, pp. 1-4, IOP Publishing.
Hirayama et al., 231-261nm AlGaN deep-ultraviolet light-emitting diodes fabricated on AlN multilayer buffers grown by ammonia pulse-flow method on sapphire, Applied Physics Letters, 2007, pp. 071901-1-071901-3, American Institute of Physics.
Hsu et al., Growth and characteristics of self-assembly defect-free GaN surface islands by molecular beam epitaxy., Apr. 2011, 1 page, J Nanosci Nanotechnol.
Imura, et al., High-Temperature Metal-Organic Vapor Phase Epitaxial Growth of AlN on Sapphire by Multi Transition Growth Mode Method Varying V/III Ratio, Japanese Journal of Applied Physics, 2006, pp. 8639-8643, vol. 45 No. 11, The Japan Society of Applied Physics.
Mathis, et al., "Modeling of threading dislocation reduction in growing GaN layers," Journal of Crystal Growth 231 (2001), pp. 371-390.
Mitrofanov et al., High quality UV AlGaN/AlGaN distributed Bragg reflectors and microcavities, Gallium Nitride Materials and Devices II, 2007, pp. 64731G-1-64731G-5, vol. 6473, SPIE.
Morkoc, Thermal Mismatch Induced Strain, Handbook of Nitride Semiconductors and Devices, 2008, pp. 290-292, vol. 1, Wiley-VCH Verlag GmbH & Co. KGaA.
Nishinaga et al., Epitaxial Lateral Overgrowth of GaAs by LPE, Japanese Journal of Applied Physics, Jun. 1988, pp. L964-L967, vol. 27 No. 6. [1].
Ohba et al., Growth of AlN on sapphire substrates by using a thin AlN bu!er layer grown two-dimensionally at a very low V/III ratio, Journal of Crystal Growth, 2000, pp. 258-261, Elsevier Science B.V.
Okada et al., Growth of high-quality and crack free AlN layers on sapphire substrate by multi-growth mode modification, Journal of Crystal Growth, 2007, pp. 349-353, Elsevier B.V.
Ponchet et al., Lateral modulations in zeronetstrained GaInAsP multilayers grown by gas source molecularbeam epitaxy, Journal of Applied Physics, 1993, pp. 3778-3782, American Institute of Physics.
Reentila et al., Effect of the AlN nucleation layer growth on AlN material quality, Journal of Crystal Growth, 2008, pp. 4932-4934, Elsevier B.V.
Sang et al., Reduction in threading dislocation densities in AlN epilayer by introducing a pulsed atomic-layer epitaxial buffer layer, Applied Physics Letters, 2008, pp. 122104-1-122104-3, American Institute of Physics.
Yamaguchi et al., Control of strain in GaN by a combination of H2 and N2 carrier gases, Journal of Applied Physics, Jun. 2001, pp. 7820-7824, vol. 89 No. 12, American Institute of Physics.
Yamaguchi et al., Metalorganic vapor phase epitaxy growth of crack-free AlN on GaN and its application to high-mobility AlN/GaN superlattices, Applied Physics Letters, Nov. 2001, pp. 3062-3064, vol. 79 No. 19, American Institute of Physics.
Yoshikawa et al., A New "Three-Step Method" for High Quality MOVPE Growth of III-Nitrideson Sapphire, phys. stat. sol., 2001, pp. 625-628, No. 2, Wiley-VCH Verlag Berlin GmbH.

(56) References Cited

OTHER PUBLICATIONS

Zhang et al., Crack-free thick AlGaN grown on sapphire using AlN/AlGaN superlattices for strain management, Applied Physics Letters, May 2002, pp. 3542-3544, vol. 80 No. 19, American Institute of Physics.
Zhang et al., Growth of Highly Conductive n-Type AI0:7Ga0:3N Film by Using AlN Buffer with Periodical Variation of V/III Ratio, Chinese Phys. Lett., 2008, pp. 4449-4452, vol. 25 No. 12, Chinese Physical Society and IOP Publishing Ltd. [18].
Zhang et al., Improvement of AlN Film Quality by Controlling the Coalescence of Nucleation Islands in Plasma-Assisted Molecular Beam Epitaxy, Chinese Phys. Lett., 2010, pp. 058101-1-058101-3, vol. 27 No. 5, Chinese Physical Society and IOP Publishing Ltd. (Chen).
Zhang et al., Pulsed atomic layer epitaxy of quaternary AlInGaN layers, Applied Physics Letters, Aug. 2001, pp. 925-927, vol. 79 No. 7, American Institute of Physics.
Webb, V., U.S. Appl. No. 13/692,191, Final Office Action 2, dated May 19, 2016, 21 pages.
Webb, V., U.S. Appl. No. 13/692,191, Non-Final Office Action 2, dated Sep. 9, 2015, 29 pages.
Webb, V., U.S. Appl. No. 13/692,191, Final Office Action 1, dated Jan. 23, 2015, 17 pages.
Webb, V., U.S. Appl. No. 13/692,191, Non-Final Office Action 1, dated Jun. 20, 2014, 18 pages.
Allen, E., U.S. Appl. No. 13/756,806, Non-Final Office Action 2, dated May 5, 2016, 23 pages.
Allen, E., U.S. Appl. No. 13/756,806, Final Office Action 1, dated Sep. 1, 2015, 38 pages.
Allen, E., U.S. Appl. No. 13/756,806, Non-Final Office Action 1, dated Dec. 9, 2014, 28 pages.
Jinzhu, C., Application No. 201380013532.2, Office Action—English translation, dated Apr. 7, 2016, 12 pages.
Choi, International Application No. PCT/US2012/067590, Search Report and Written Opinion, dated Mar. 26, 2013, 11 pages.
Choi, International Application No. PCT/US2013/024310, Search Report and Written Opinion, dated May 15, 2013, 9 pages.
Webb, V., U.S. Appl. No. 13/692,191, Notice of Allowance, dated Aug. 1, 2017, 22 pages.
Jinzhu, C., Application No. 201380013532.2, Rejection Decision (with English translation), dated Apr. 13, 2017, 10 pages.
Jinzhu, C., Application No. 201380013532.2, Notification of Reexamination, Board Opinion (with English translation), dated Jan. 24, 2018, 12 pages.
Allen III, E., U.S. Appl. No. 13/756,806, Interview Summary, dated May 18, 2018, 4 pages.
Nadav, O., U.S. Appl. No. 13/756,806, Ex Parte Quayle Action, Sep. 6, 2018, 4 pages.
Picardat. K., U.S. Appl. No. 16/021,347, Office Action 1, dated Oct. 4, 2018, 5 pages.
Nadav, O., U.S. Appl. No. 13/756,806, dated Oct. 11, 2018, 5 pages.

* cited by examiner

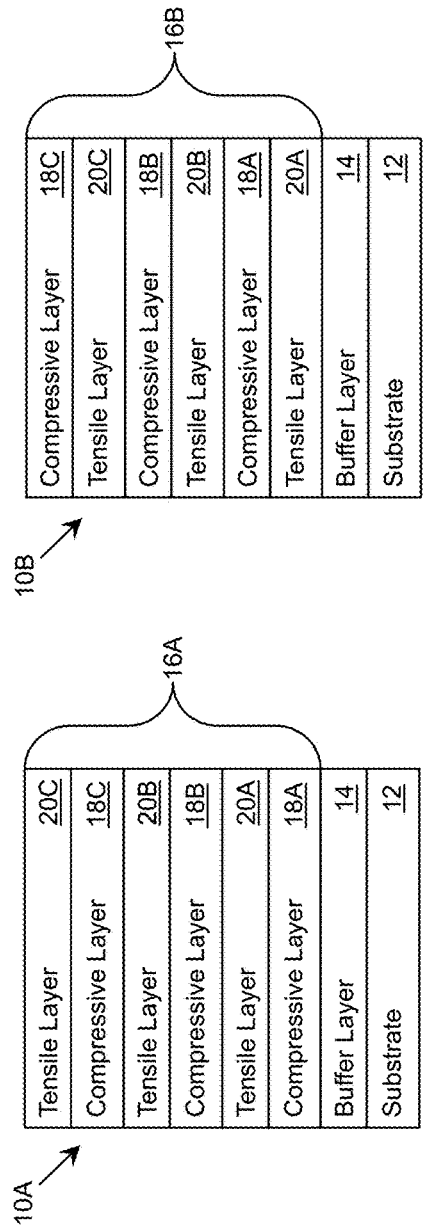
FIG. 4A
FIG. 4B
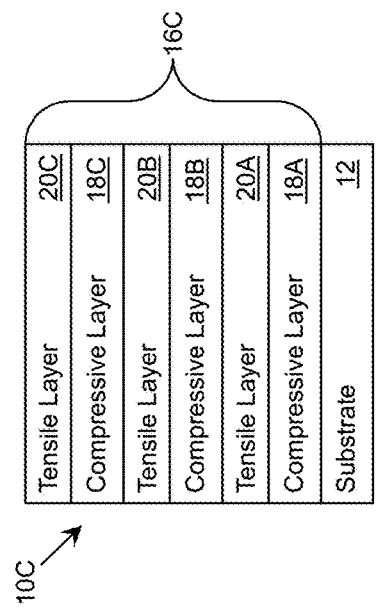
FIG. 4C

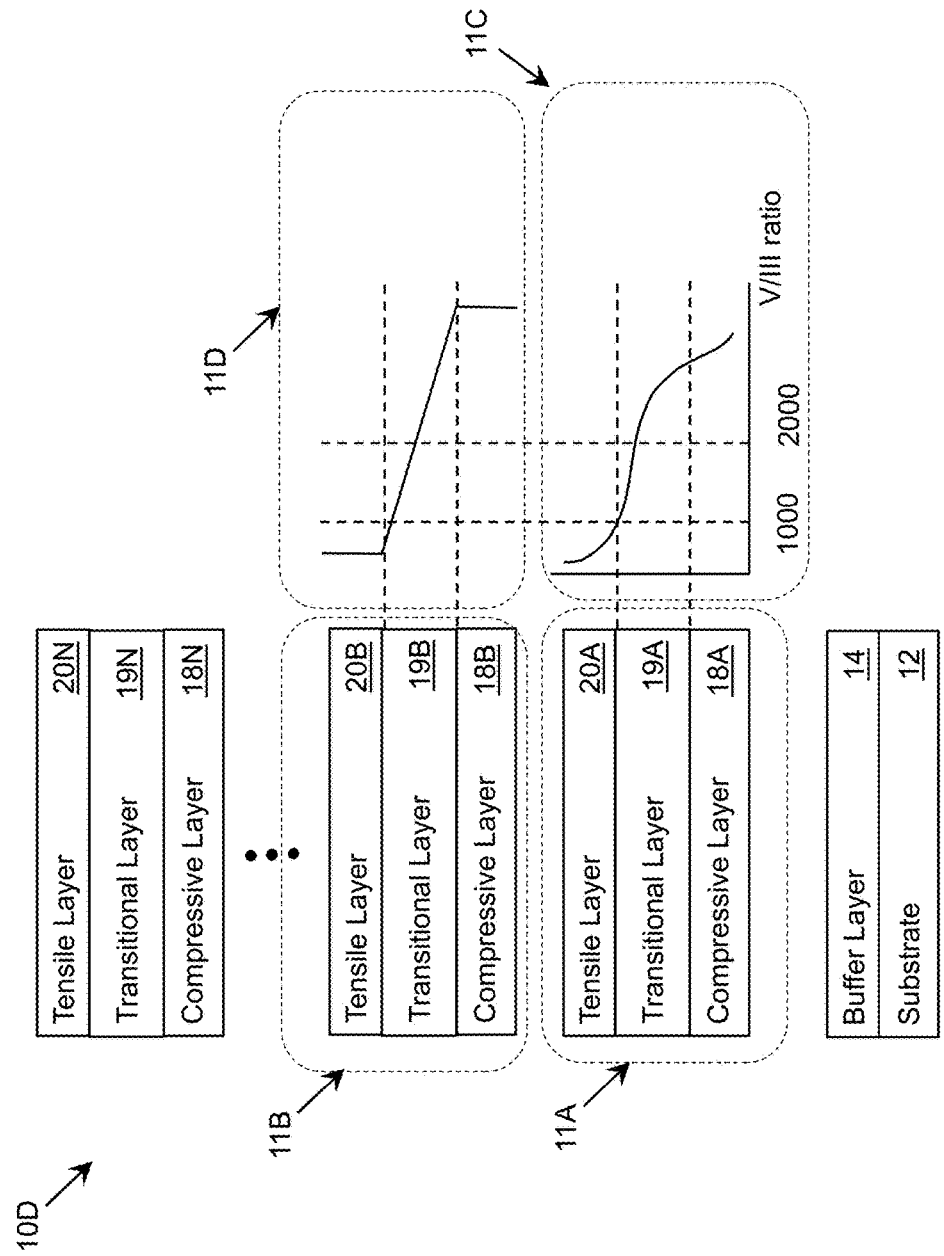

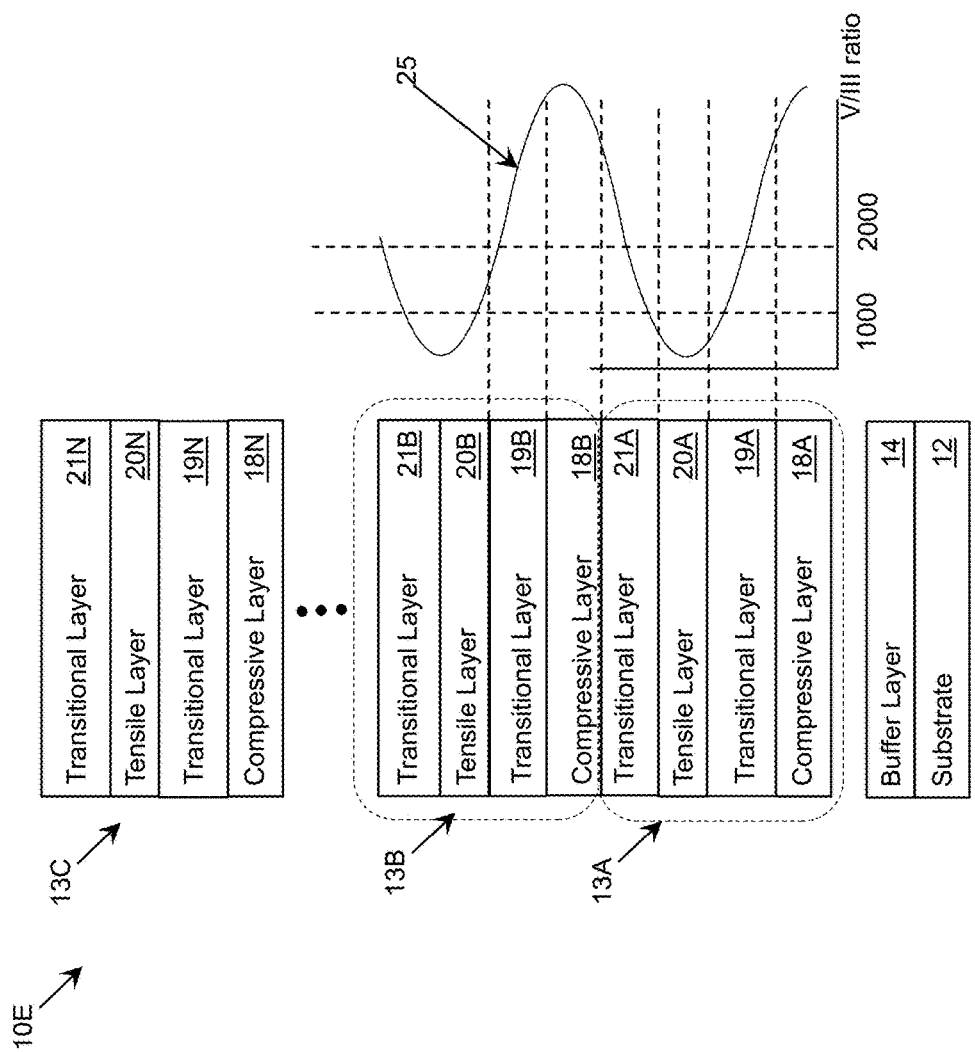

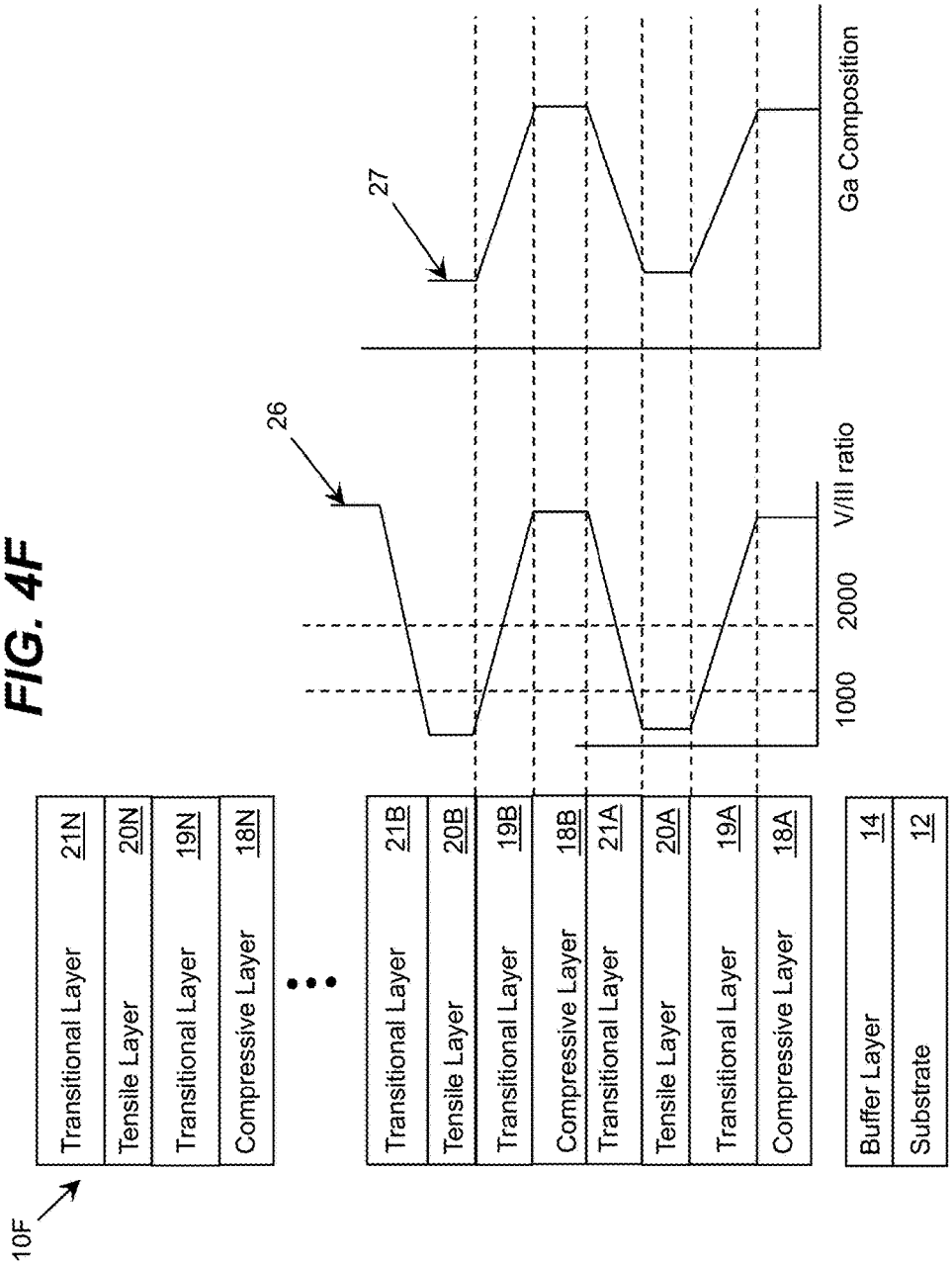

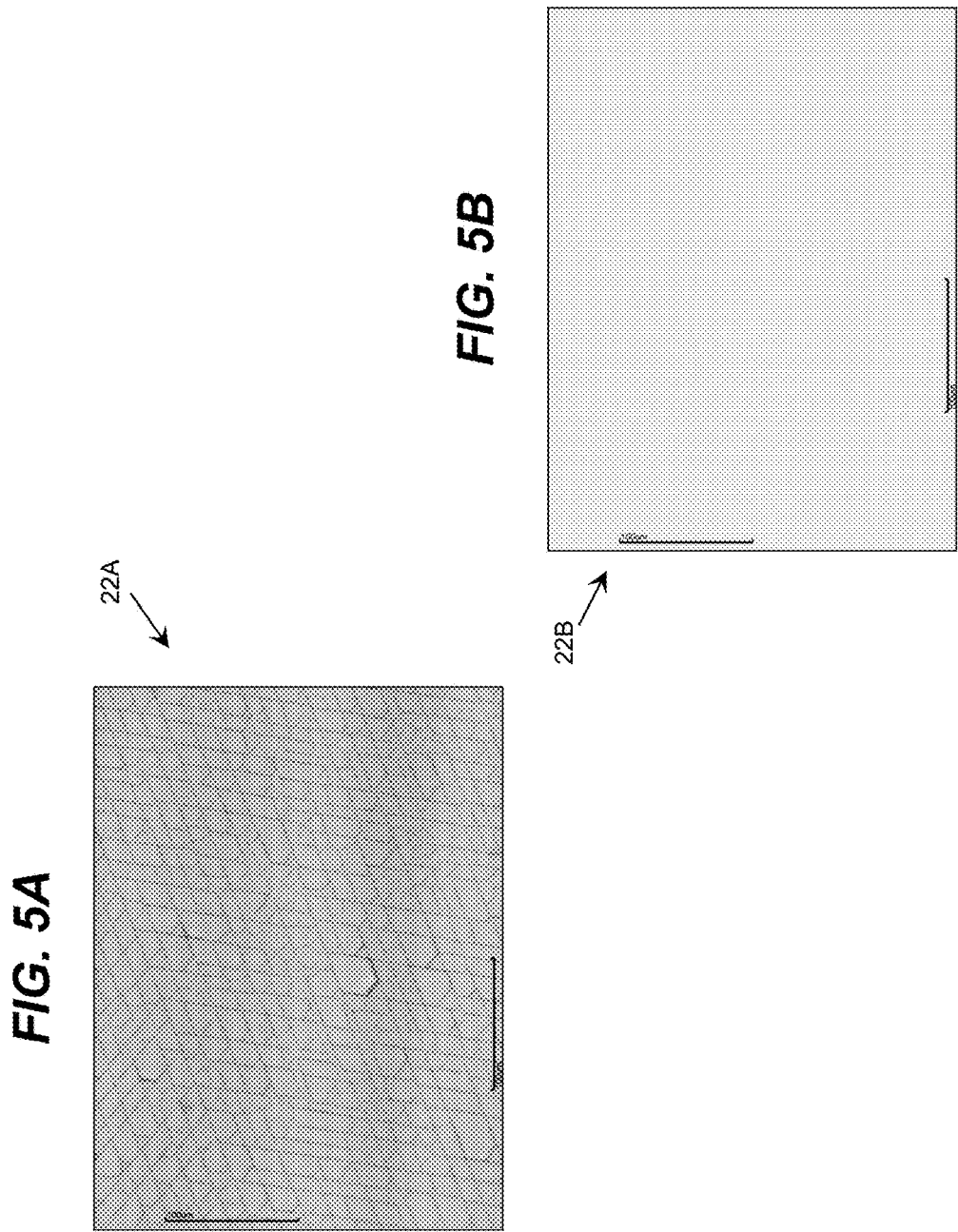

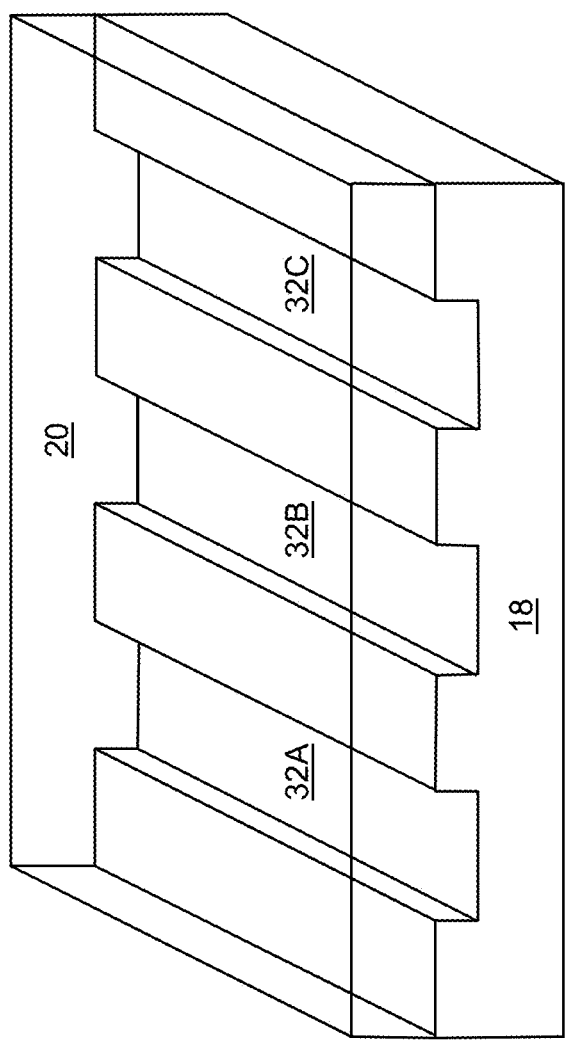

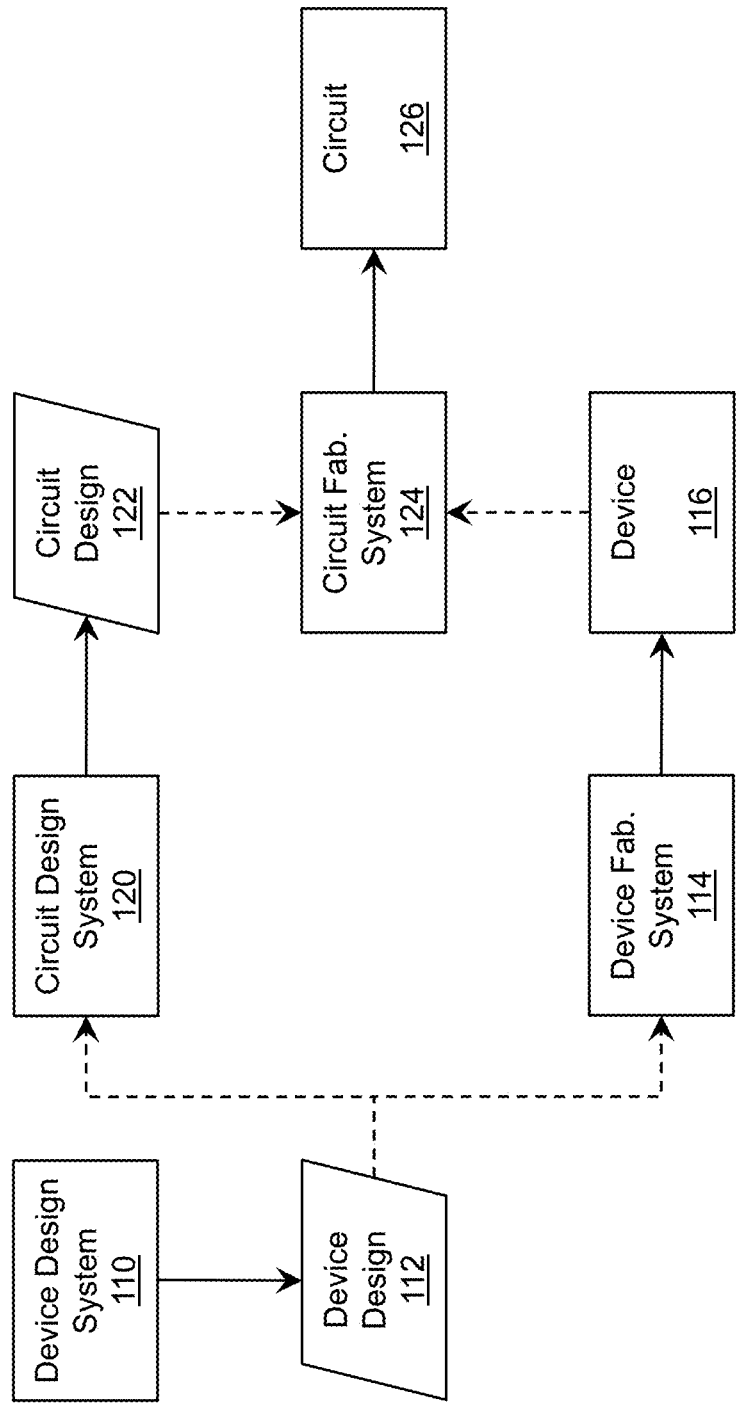

10,158,044 B2

EPITAXY TECHNIQUE FOR GROWING SEMICONDUCTOR COMPOUNDS

REFERENCE TO RELATED APPLICATIONS

The current application is a continuation-in-part of U.S. application Ser. No. 13/692,191, which was filed on 3 Dec. 2012, which claims the benefit of U.S. Provisional Application No. 61/566,606, which was filed on 3 Dec. 2011, both of which are hereby incorporated by reference.

GOVERNMENT LICENSE RIGHTS

This invention was made with government support under contract no. W911NF-10-2-0023 awarded by the Defense Advanced Research Projects Agency (DARPA). The government has certain rights in the invention.

TECHNICAL FIELD

The disclosure relates generally to growing semiconductor compounds, and more particularly, to an epitaxy technique for such growth, which can result in a low stress compound.

BACKGROUND ART

For light emitting devices, such as light emitting diodes (LEDs) and especially deep ultraviolet LEDs (DUV LEDs), minimizing a dislocation density and a number of cracks in the semiconductor layers increases the efficiency of the device. To this extent, several approaches have sought to grow low-defect semiconductor layers on patterned substrates. These approaches typically rely on reducing stresses present in epitaxially grown semiconductor layers.

For example, one approach to reduce stress accumulation in an epitaxially grown layer relies on patterning the underlying substrate using microchannel epitaxy (MCE). Using MCE, a narrow channel is used as a nucleation center containing low defect information from the substrate. An opening in a mask acts as a microchannel, which transfers crystal information to the overgrown layer, while the mask prevents dislocations from transferring to the overgrown layer. As a result, the overgrown layer can become dislocation free. The three-dimensional structure of the MCE also provides another advantage to stress release. The residual stress can be released effectively since the overgrown layer easily deforms. In another approach, a mask is applied at a location of a large concentration of dislocation densities to block their further propagation.

Other approaches rely on epitaxially growing a group III nitride based semiconductor superlattice. The superlattice structure mitigates the strain difference between an aluminum nitride (AlN)/sapphire template and the subsequent thick $Al_xGa_{1-x}N$ (where $0 \le x \le 1$) layers. For devices such as DUV LEDs, thick AlGaN epitaxial layers (e.g., of the order of a few micrometers) are desirable to reduce current crowding. Using a superlattice approach, an AlN/AlGaN superlattice was grown to reduce biaxial tensile strain and a 3.0-μm thick $Al_{0.2}Ga_{0.8}N$ was grown on sapphire without any cracks. Similarly, a superlattice structure shown in FIG. 1A can comprise a periodic structure with each element 2A-2D composed of alternating sublayers of semiconductor materials with different polarizations and different accumulated stresses in the sublayers. Such a superlattice can be used to minimize the dislocation density due to varying stresses in the sublayers of the superlattice elements.

While the superlattice approaches allow some control of tensile and compressive stresses in epitaxially grown nitride semiconductor layers, the approaches do not enable epitaxial growth of nitride based semiconductor layers with uniform composition. To grow such layers, variation of nitrogen and aluminum vacancies has been explored. For example, FIGS. 1B and 1C illustrate one approach for fabricating AlN multilayer buffers according to the prior art. In particular, FIG. 1B shows the gas flow sequence used for $NH_3$ pulse-flow growth, while FIG. 1C shows a schematic structure of the AlN buffer. In a first step, an AlN nucleation layer and an initial AlN layer are deposited using $NH_3$ pulse-flow growth. A low threading dislocation density was achieved by a coalescence process of the AlN nucleation layer. For example, as observed from a cross-sectional transmission electron microscope (TEM) image, edge-type and screw-type dislocation densities of an AlGaN layer on an AlN buffer layer were reported as $3.2 \times 10^9$ and $3.5 \times 10^8$ $cm^{-2}$, respectively.

SUMMARY OF THE INVENTION

Aspects of the invention provide a solution for fabricating a semiconductor structure. The semiconductor structure includes a plurality of semiconductor layers grown over a substrate using a set of epitaxial growth periods. During each epitaxial growth period, a first semiconductor layer having one of: a tensile stress or a compressive stress is grown followed by growth of a second semiconductor layer having the other of: the tensile stress or the compressive stress directly on the first semiconductor layer. In this manner, the overall residual stress for the plurality of semiconductor layers can be approximately zero, which can result in the semiconductor structure having a reduced number of cracks and/or threading dislocations than prior art approaches.

A first aspect of the invention provides a method of fabricating a semiconductor structure, the method comprising: growing a plurality of semiconductor layers over a substrate using a set of epitaxial growth periods, wherein each epitaxial growth period includes: epitaxially growing a first semiconductor layer having one of: a tensile stress or a compressive stress; and epitaxially growing a second semiconductor layer having the other of: the tensile stress or the compressive stress directly on the first semiconductor layer.

A second aspect of the invention provides a semiconductor structure including: a substrate; and a plurality of semiconductor layers on the substrate, the plurality of semiconductor layers including a set of periods, each period including: a first semiconductor layer, wherein the first semiconductor layer has one of: a tensile stress or a compressive stress; and a second semiconductor layer directly on the first semiconductor layer, wherein the second semiconductor layer has the other of: the tensile stress or the compressive stress.

A third aspect of the invention provides a method of fabricating a semiconductor structure, the method comprising: growing a plurality of group III nitride semiconductor layers over a substrate using a set of epitaxial growth periods, wherein each epitaxial growth period includes: epitaxially growing a first group III nitride semiconductor layer having one of: a tensile stress or a compressive stress; and epitaxially growing a second group III nitride semiconductor layer having the other of: the tensile stress or the compressive stress directly on the first semiconductor layer, wherein the epitaxially growing the first semiconductor layer and the epitaxially growing the second semiconductor layer use molar ratios of group V precursors to group III precursors that differ by at least ten percent.

The illustrative aspects of the invention are designed to solve one or more of the problems herein described and/or one or more other problems not discussed.

BRIEF DESCRIPTION OF THE DRAWINGS

These and other features of the disclosure will be more readily understood from the following detailed description of the various aspects of the invention taken in conjunction with the accompanying drawings that depict various aspects of the invention.

FIGS. 4A-4G show illustrative structures according to embodiments.

FIGS. 5A and 5B show illustrative bright field optical microscope images of layers according to an embodiment.

FIGS. 8A and 8B show illustrative patterns of a surface of a compressive layer with a tensile layer grown thereon according to embodiments.

FIG. 10 shows an illustrative flow diagram for fabricating a circuit according to an embodiment.

It is noted that the drawings may not be to scale. The drawings are intended to depict only typical aspects of the invention, and therefore should not be considered as limiting the scope of the invention. In the drawings, like numbering represents like elements between the drawings.

DETAILED DESCRIPTION OF THE INVENTION

Figure 1A:
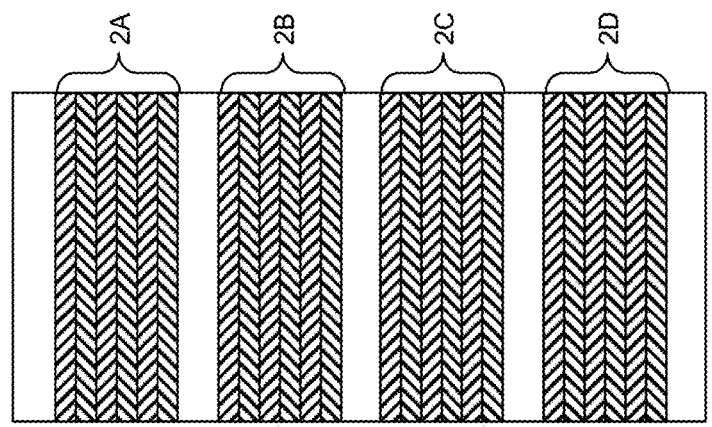
FIGS. 1A-1C show approaches for reducing dislocation density according to the prior art.
Figure 1B:
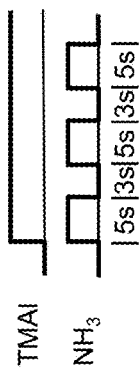
Figure 1C:
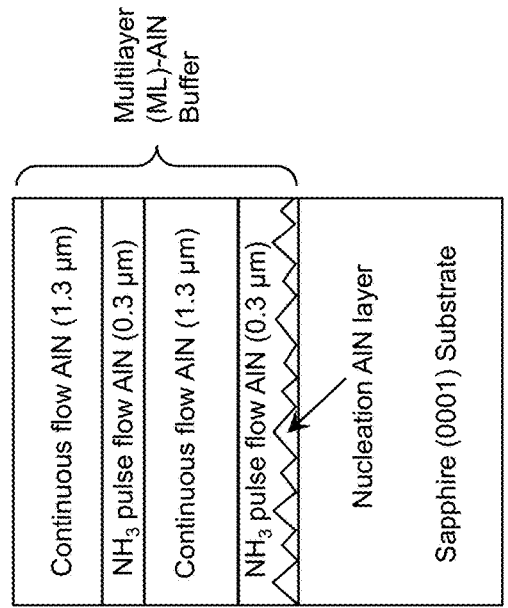

As indicated above, aspects of the invention provide a solution for fabricating a semiconductor structure. The semiconductor structure includes a plurality of semiconductor layers grown over a substrate using a set of epitaxial growth periods. During each epitaxial growth period, a first semiconductor layer having one of: a tensile stress or a compressive stress is grown followed by growth of a second semiconductor layer having the other of: the tensile stress or the compressive stress directly on the first semiconductor layer. In this manner, the overall residual stress for the plurality of semiconductor layers can be approximately zero, which can result in the semiconductor structure having a reduced number of cracks and/or threading dislocations than prior art approaches. As used herein, unless otherwise noted, the term "set" means one or more (i.e., at least one) and the phrase "any solution" means any now known or later developed solution.

Aspects of the invention are directed to the growth of semiconductor layers on a substrate. In an embodiment, the semiconductor layers are formed of elements selected from the group III-V materials system. In a more particular embodiment, the semiconductor layers are formed of group III nitride materials. Group III nitride materials comprise one or more group III elements (e.g., boron (B), aluminum (Al), gallium (Ga), and indium (In)) and nitrogen (N), such that $B_WAl_XGa_YIn_ZN$, where $0 \leq W, X, Y, Z \leq 1$, and $W+X+Y+Z=1$. Illustrative group III nitride materials include AlN, GaN, InN, BN, AlGaN, AlInN, AlBN, AlGaInN, AlGaBN, AlInBN, and AlGaInBN with any molar fraction of group III elements.

The substrate can comprise any type of substrate exhibiting a lattice mismatch with the semiconductor layer grown thereon. To this extent, the substrate can have a lattice constant that is different from a lattice constant corresponding to one of the semiconductor layers epitaxially grown thereon. As used herein, a substrate is lattice mismatched with a semiconductor layer when the lattice constants differ by more than one percent (e.g., as calculated by the lattice constant of the semiconductor layer minus the lattice constant of the substrate divided by the lattice constant of the semiconductor layer). In an embodiment, the substrate is an insulating material, such as sapphire or silicon carbide (SiC). However, the substrate can comprise any suitable material, such as silicon (Si), a nitride substrate (e.g., AlN, GaN, BN, AlGaN, and/or the like), an oxide substrate (e.g., aluminum oxynitride, zinc oxide (ZnO), lithium gallate ($LiGaO_2$), lithium aluminate ($LiAlO_2$), magnesium aluminate ($MgAl_2O_4$), scandium magnesium aluminum oxide ($ScMgAlO_4$), and/or the like), and/or other related materials.

The layer(s) grown as described herein can be implemented as part of any type of semiconductor device. In an embodiment, the semiconductor device is an emitting device. In a more particular embodiment, the emitting device is configured to operate as a light emitting diode (LED), such as a conventional or super luminescent LED. Similarly, the emitting device can be configured to operate as a laser, such as a laser diode (LD). In another embodiment, the semiconductor device is configured to operate as a photodetector, photomultiplier, and/or the like. Regardless, electromagnetic radiation emitted or detected by the device can comprise a peak wavelength within any range of wavelengths, including visible light, ultraviolet radiation, deep ultraviolet radiation, infrared light, and/or the like.

Aspects of the invention utilize an ability to selectively grow a layer exhibiting either tensile or compressive residual stress depending on the deposition conditions. For example, a change in a set of the deposition conditions for growing an aluminum nitride (AlN) epitaxial layer on a foreign substrate can result in the layer exhibiting either tensile or compressive residual stress. In an embodiment, the set of deposition conditions includes a molar ratio of group V precursors to group III precursors (V/III ratio), which can be altered during the growth of a group III-V semiconductor layer.

Figure 2:
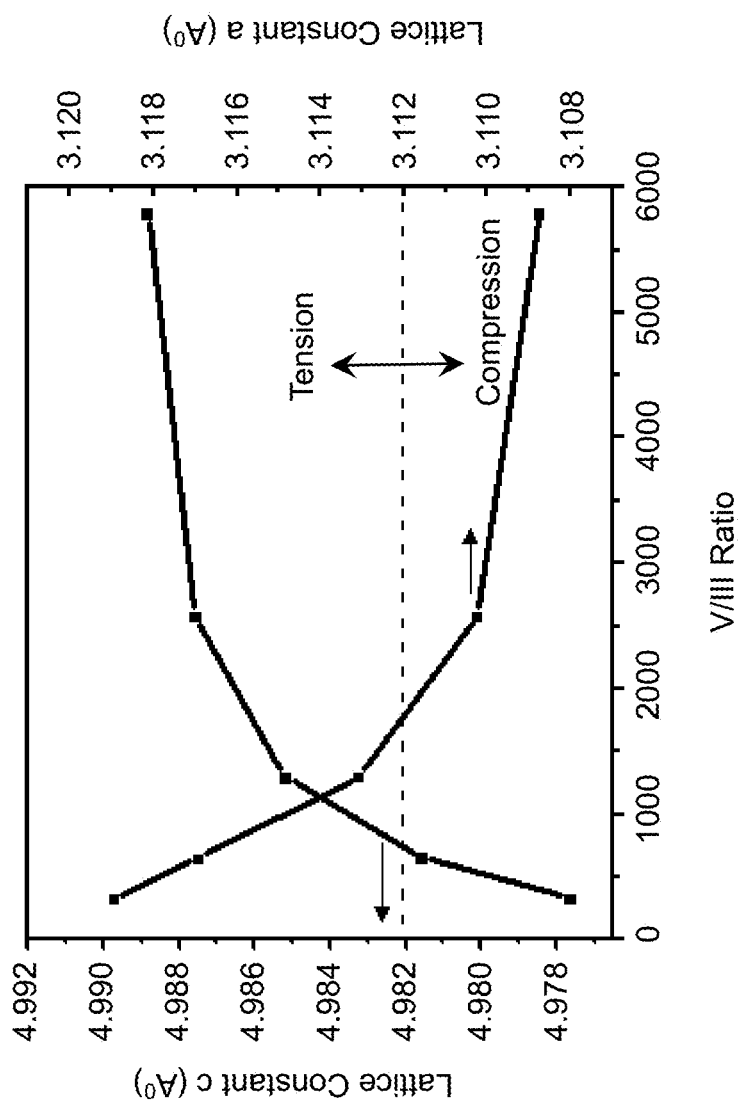
FIG. 2 shows illustrative plots of the lattice constants a and c as a function of the V/III ratio for an AlN layer according to an embodiment.

To this extent, FIG. 2 shows illustrative plots of the lattice constants a and c as a function of the V/III ratio for an AlN layer according to an embodiment. Different lattice directions can result in different tensile and compressive properties for the AlN layer. For example, for a low V/III ratio (e.g., less than approximately 1800), the lattice constant a for the AlN layer is slightly larger than the lattice constant a for an AlN layer without the presence of point defects (e.g., approximately 3.112). The difference in the lattice constant a results in tensile stresses being accumulated in the layer. For a high V/III ratio (e.g., greater than approximately 1800), the lattice constant a for the AlN layer is slightly smaller than the lattice constant a for an AlN layer without the presence of point defects, which results in compressive stresses being accumulated in the layer. The V/III ratio also influences the lattice constant c. In this case, small values of the V/III ratio (e.g., below approximately 750) result in a lattice constant c, which causes compressive stress (e.g., is below approximately 4.982) in the layer, while larger values of the V/III ratio (e.g., above approximately 750) result in a lattice constant c, which causes tensile stress in the layer.

Figure 3:
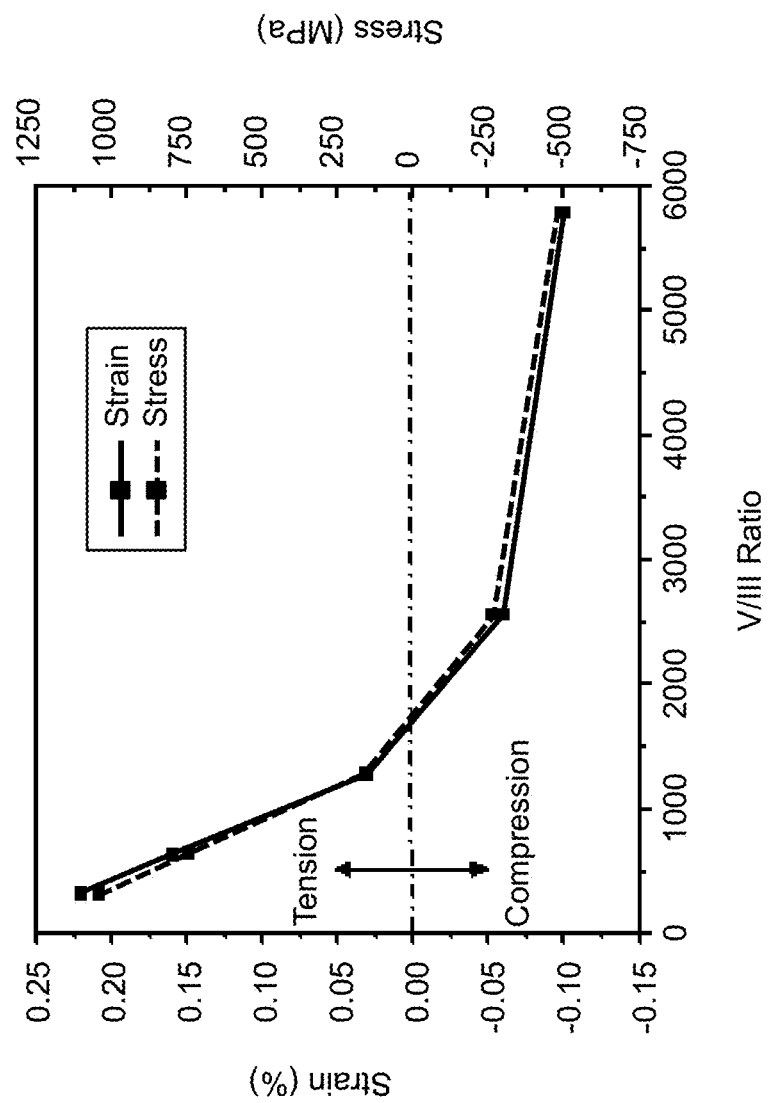
FIG. 3 shows illustrative plots of stress and strain as a function of the V/III ratio for an AlN layer according to an embodiment.

FIG. 3 shows illustrative plots of stress and strain as a function of the V/III ratio for an AlN layer according to an embodiment. As illustrated, an AlN layer grown under a low V/III ratio (e.g., less than approximately 1800) is in tensile stress, while an AlN layer grown with a high V/III ratio (e.g., above approximately 1800) is in compressive stress. As further illustrated, only small changes in the strain of the AlN layer are produced by modulating the V/III ratio.

In an embodiment, growth of a semiconductor heterostructure (e.g., a layer), such as a group III-V based heterostructure, includes growth of a series of layers (e.g., films) with alternating tensile and compressive stresses. A layer can be selectively configured to have tensile or compressive stress by modulating a V/III ratio in each layer. For example, the modulation can include varying the V/III ratio according to a set schedule to yield compressive and tensile semiconductor layers. Additionally, one or more additional deposition conditions can be changed, such as a growth temperature, a gas flow, and/or the like. Furthermore, one or more attributes of the layers, such as a relative thickness of a layer, a distribution of stress within each layer, and/or the like, can be adjusted during the growth of the layer. The modulation of the set of deposition conditions can result in regions of increased compressive stresses and regions of increased tensile stress. In this manner, the resulting semiconductor structure can be configured to have a condition of approximately zero (or near zero) overall residual stress.

FIGS. 4A-4C show illustrative structures 10A-10C according to embodiments. Each structure 10A-10C includes a substrate 12, which can be a foreign substrate, such as sapphire, SiC, or the like. Furthermore, the structures 10A, 10B include a buffer layer 14 (e.g., a nucleation layer) grown directly on the substrate 12. The buffer layer 14 can provide a transition to accommodate a large lattice mismatch between the substrate 12 and the subsequent semiconductor heterostructure 16A-16C. In an embodiment, the buffer layer 14 can comprise an $Al_xGa_{1-x}N/Al_yGa_{1-y}N$ superlattice, where $0 \leq x$, $y \leq 1$. Each superlattice layer can be, for example, up to several nanometers thick. In an embodiment, the layers with differing aluminum content (e.g., denoted by x and y) can have similar thicknesses. In an illustrative embodiment, the buffer layer 14 has a thickness in a range from nearly zero nanometers to approximately 2000 nanometers. In another embodiment, growth of the buffer layer 14 uses a growth temperature between approximately 500 and approximately 1200 degrees Celsius and a growth rate between approximately 0.01 micrometers and approximately 10 micrometers per hour. However, as illustrated by the structure 10C, embodiments of the structure can be formed without the buffer layer 14, e.g., based on the material of the substrate and/or the corresponding lattice mismatch.

Regardless, each of the structures 10A-10C includes a semiconductor heterostructure 16A-16C grown on the substrate 12. Each semiconductor heterostructure 16A-16C is formed of a plurality of compressive layers 18A-18C alternating with a plurality of tensile layers 20A-20C. In the structures 10A, 10C, a compressive layer 18A is first grown, while in the structure 10B, a tensile layer 20A is first grown.

While each semiconductor heterostructure 16A-16C is shown including three periods of epitaxial growth (e.g., each period including a compressive and a tensile layer), it is understood that a semiconductor heterostructure can include any number of periods. In an embodiment, the stress changes abruptly between a compressive layer and the adjacent tensile layer. Alternatively, the stress can gradually change between adjacent layers (e.g., by growing layers having a graded tensile or compressive stress). Furthermore, the tensile and compressive stress can be substantially constant between periods of the semiconductor heterostructure 16A-16C or can gradually change from period to period.

The growth of a semiconductor heterostructure 16A-16C, and the growth of the corresponding layers 18A-18C, 20A-20C forming the semiconductor heterostructure 16A-16C, can use any set of deposition conditions. For example, the set of deposition conditions for a layer 18A-18C, 20A-20C can include: a group III precursor flow rate between approximately 0.1 and approximately 200 micromoles per minute; a nitrogen precursor flow rate between approximately 100 and 10000 standard cubic centimeters per minute (SCCM); a pressure between approximately 1 and 760 Torr; a molar ratio of group V precursors to group III precursors (V/III ratio) between approximately 10 and approximately 1000; and a growth temperature between approximately 500 and approximately 1800 degrees Celsius. Furthermore, a layer 18A-18C, 20A-20C can be grown to a thickness that is greater than a critical thickness to avoid pseudomorphic growth. In an embodiment, each layer 18A-18C, 20A-20C has a thickness between approximately one nanometer and five micrometers.

As described herein, during the growth of a semiconductor heterostructure 16A-16C, one or more of a set of the deposition conditions for epitaxially growing a layer 18A-18C, 20A-20C can be changed to cause the resulting layer 18A-18C, 20A-20C to exhibit either tensile or compressive residual stress. For example, the growth of a compressive layer and the growth of a tensile layer can use molar ratios of group V precursors to group III precursors that differ by at least ten percent. In an embodiment, a composition of the compressive layer differs from a composition of the tensile layer by no more than approximately five percent. For example, a fraction of aluminum in the tensile layer can differ from a fraction of aluminum in the compressive layer by no more than approximately five percent. Similarly, the compressive and tensile layers can have a lattice mismatch of at least 0.0001 Angstroms. Furthermore, a growth rate for the compressive and tensile layers can be changed. In an embodiment, the growth rates for the compressive and tensile layers differ by at least ten percent. A growth temperature for the compressive and tensile layers can be substantially the same or changed. In an embodiment, the growth temperatures for the compressive and tensile layers differ by at least two percent.

FIGS. 4D-4G show illustrative structures 10D-10G according to additional embodiments. Similar to the structures 10A-10C shown in FIGS. 4A-4C, each structure 10D-10G can include a substrate 12 and a buffer layer 14. However, it is understood that embodiments of the structures 10D-10G can be fabricated without the buffer layer 14 as described herein. Each structure 10D-10G also includes a plurality of compressive layers 18A-18N alternating with a plurality of tensile layers 20A-20N, each of which can be formed as described herein in conjunction with the structures shown in FIGS. 4A-4C. However, the structures 10D-10G also include a set of transitional layers located between adjacent compressive and tensile layers to form a plurality of periods 11A, 11B (e.g., a period 11A includes a compressive layer 18A, a transitional layer 19A, and a tensile layer 20A).

For example, FIG. 4D shows a transitional layer 19A-19N located between a pair of layers (e.g., each compressive layer 18A-18N and tensile layer 20A-20N). In an embodiment, the transitional layer 19A-19N can comprise a layer with a V/III ratio which results in a lattice constant that matches the 0 compressive or tensile strain as shown in FIG. 3. That is, the transitional layer 19A-19N includes a region that has no tensile or compressive stresses. In an embodiment, the value of the V/III ratio can be approximately 1500. In an embodiment, the V/III ratio can vary continuously through the first period 11A, which includes a compressive layer 18A, a transitional layer 19A, and a tensile layer 20A, which is shown in plot 11C. That is, both the compressive and tensile layers 18A, 20A can have a graded/changing V/III ratio. In another embodiment, a plot 11D shows the V/III ratio dependence on a second period 11B (e.g., a compressive layer 18B, a transitional layer 19B, a tensile layer 20B). In this embodiment, the V/III ratio can be constant in both the tensile layer 20B and the compressive layer 18B and have a smooth rapid change in the transitional layer 19B. It is understood that the V/III ratio can be a continuous function having a generally smooth behavior and broadly classified into a compressive layer 18A, 18B, 18N, a transitional layer 19A, 19B, 19N, and a tensile layer 20A, 20B, 20N.

In the structure 10E shown in FIG. 4E, in addition to the transitional layer 19A-19N deposited after each compressive layer 18A-18N, another transitional layer 21A-N can be deposited after each tensile layer 20A-20N. In an embodiment, the grading of stresses is achieved by varying the V/III ratio continuously, as shown by a curve 25. The higher values of the V/III ratio correspond to the compressive layers 18A-18N, while the lower values of the V/III ratio correspond to the tensile layers 20A-20N, and the values between the higher values and the lower values of the V/III ratio correspond to the transitional layers 19A-19N, 21A-21N. In this embodiment, the V/III ratio is a continuous function throughout each period 13A, 13B, 13C.

Turning now to FIG. 4F, the structure 1 OF is similar to the structure 10E shown in FIG. 4E, with two sets of transitional layers 19A-19N, 21A-21N. However, the V/III ratio in the structure 10F can be changed discretely, instead of continuously. For example, as shown by the curve 26, the V/III ratio in the compressive and tensile layers 18A-18N, 20A-20N can be constant throughout the thickness of the layer and the V/III ratio can change linearly throughout the thickness of the transitional layers 19A-19N, 21A-21N. In an embodiment, in addition to changing the V/III ratio, the composition of one or more of the layers 18A-18N, 19A-19N, 20A-20N, 21A-21N can be changed. For example, a curve 27 shows an illustrative change in the Ga composition of the layers.

It is understood that the transitional layers 19A-19N located after each compressive layer 18A-18N can be different from the transitional layers 21A-21N located after each tensile layer 20A-20N. For example, as illustrated, the grading direction of the V/III ratio, the composition, or both, as shown in the curves 26, 27 can be different for the transitional layers. In any of the structures 10D-10F shown, it is understood that the structure of any layer does not have to be periodic and the thickness of any layer can be varied throughout the structure 10D-10F. The structure and/or thickness can be varied in order to manage stresses within the structure 10D-10F and/or for the reduction of dislocations within the structure 10D-10F. For example, the thickness of the compressive layers 18A-18N and/or the tensile layers 20A-20N can decrease closer to the top portion of the structure 10D-10F (e.g., away from the substrate 12 and the buffer layer 14). In another embodiment, the amplitude of the variation of the V/III ratio can vary throughout the structure 10D-10F for a larger lattice mismatch between the tensile layers 20A-20N and the compressive layers 18A-18N. In another embodiment, the composition can vary throughout the thickness of each layer. Additionally, in any embodiment described herein, either one or both of the plurality of compressive layers 18A-18N and the plurality of tensile layers 20A-20N can be laterally discontinuous. In such embodiments, the layers can have discontinuous regions with a lateral characteristic dimension between approximately 2 nm and approximately 2 μm.

Figure 4G:
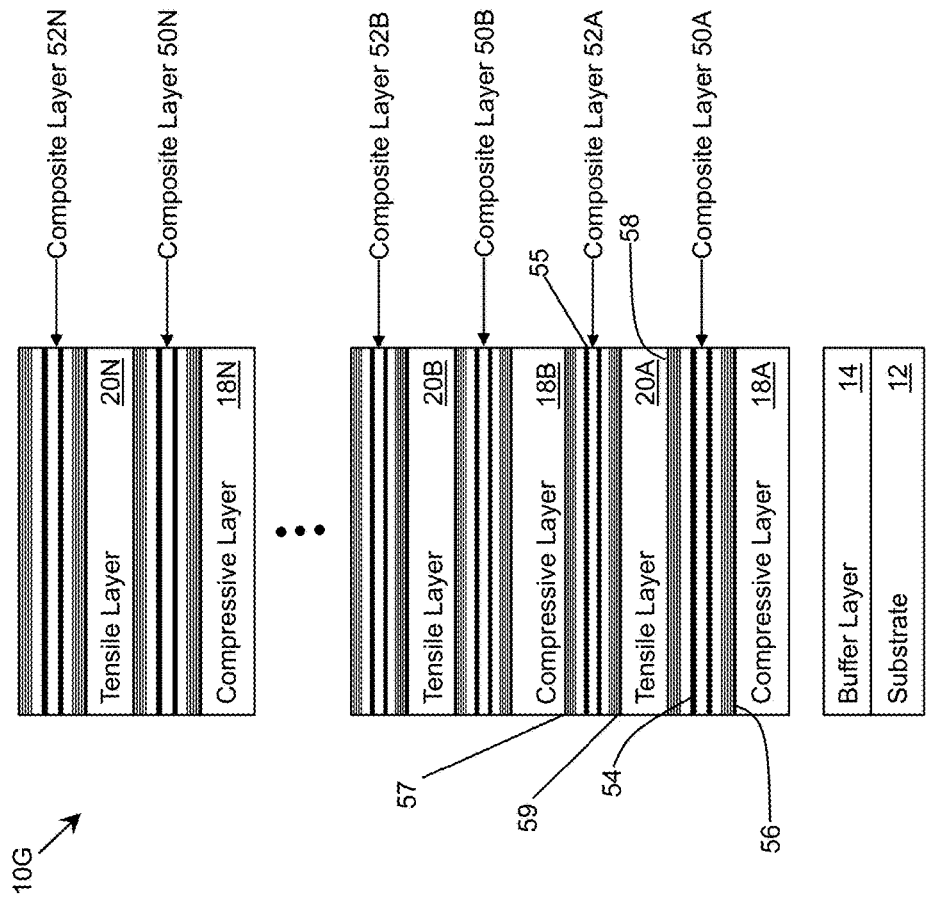

Turning now to FIG. 4G, a structure 10G according to an embodiment is shown. The structure 10G can include a first set of composite layers 50A-50N, each of which is located above a compressive layer 18A-18N, and a second set of composite layers 52A-52N, each of which is located above a tensile layer 20A-20N. In this embodiment, the sets of composite layers 50A-50N, 52A-52N can comprise the same composition as the compressive layers 18A-18N and the tensile layers 20A-20N.

However, the composite layers 50A-50N, 52A-52N can also include a set of thin semiconductor interlayers 54, 55. In an embodiment, the set of interlayers 54, 55 can have a composition that is different from a remaining portion of the corresponding composite layer 50A-50N, 52A-52N. For example, the set of interlayers 54, 55 can have a composition that includes a higher Ga molar fraction or a higher Al molar fraction than a remaining portion of the corresponding composite layer 50A-50N, 52A-52N. In an embodiment, in the composite layer 50A, the interlayers 54 that are closer to a first side 56 adjacent to a compressive layer 18A can include a composition that has a higher Ga molar fraction than a remaining portion of the composite layer 50A, while the interlayers 54 that are closer to a second side 58 adjacent to a tensile layer 20A can include a composition that has a higher Al molar fraction than a remaining portion of the composite layer 50A. In an embodiment, the interlayers 55 in the composite layer 52A can have similar but reverse structure as to the interlayers 54 in the composite layer 50A. For example, the interlayers 55 closer to a first side 59 adjacent to the tensile layer 20A can include a composition that has a higher Al molar fraction than a remaining portion of the composite layer 52A, while the interlayers 55 closer to a second side 57 adjacent to the compressive layer 18B can include a composition that has a higher Ga molar fraction than a remaining portion of the composite layer 52A.

It is understood that the molar fractions and the thicknesses of the set of interlayers 54 can be selected to provide a smooth transition between the compressive layers 18A-18N and the tensile layers 20A-20N. In another embodiment, the set of interlayers 54 can include a V/III ratio that is different from a V/III ratio of a remaining portion of the corresponding composite layer 50A-50N, 52A-52N. For example, the interlayers 54 that are located adjacent to the first side 56 that is closer to the compressive layer 18A can include a V/III ratio that is higher than a remaining portion of the composite layer 50A, while the interlayers 54 that are located adjacent to the second side 58 that is closer to the tensile layer 20A can include a V/III ratio that is lower than a remaining portion of the composite layer 50A.

In any of the structures 10D-10G shown in FIGS. 4D-4G, the transitional layers 19A-19N, 21A-21N and the composite layers 50A-50N, 52A-52N can also include doping densities that are significantly different from the doping density of the compressive layers 18A-18N and the tensile layers 20A-20N. In an embodiment, the differences can be equal to or greater than 100% different. This change in doping density between the layers can lead to changes in stresses within the layers, which can further affect the overall stresses within the structures 10D-10G. For example, in FIG. 4E, the transitional layer 19A can comprise a graded doping composition or a delta doping composition with doped interlayers in the proximity of the interface of the transitional layer 19A and the tensile layer 20A. In another example, the transitional layer 19A can comprise graded doping composition or delta doping composition with doped interlayers in the proximity of the interface of the transitional layer 19A and the compressive layer 18A. In another example, the doped interlayers can be in a central portion of the transitional layer 19A. It is understood that the transitional layers 19A-19N, 21A-21N and the composite layers 50A-50N, 52A-52N can be modified using more than one approach discussed herein (e.g., modifying the V/III ratio, the composition, and/or the doping density).

Dislocation density of a layer can be analyzed using bright field optical microscope images. To this extent, FIGS. 5A and 5B show illustrative bright field optical microscope images 22A, 22B of layers according to an embodiment. In FIG. 5A, the image 22A corresponds to a layer grown without any strain modulation described herein. As illustrated, the layer includes various micro-cracks. In FIG. 5B, the image 22B corresponds to a layer grown using strain modulation described herein. As illustrated, the layer shown in the image 22B has a significant reduction in the number of cracks, and is substantially crack-free. In each image 22A, 22B, the black bars indicate a distance of one hundred micrometers.

Figure 6:
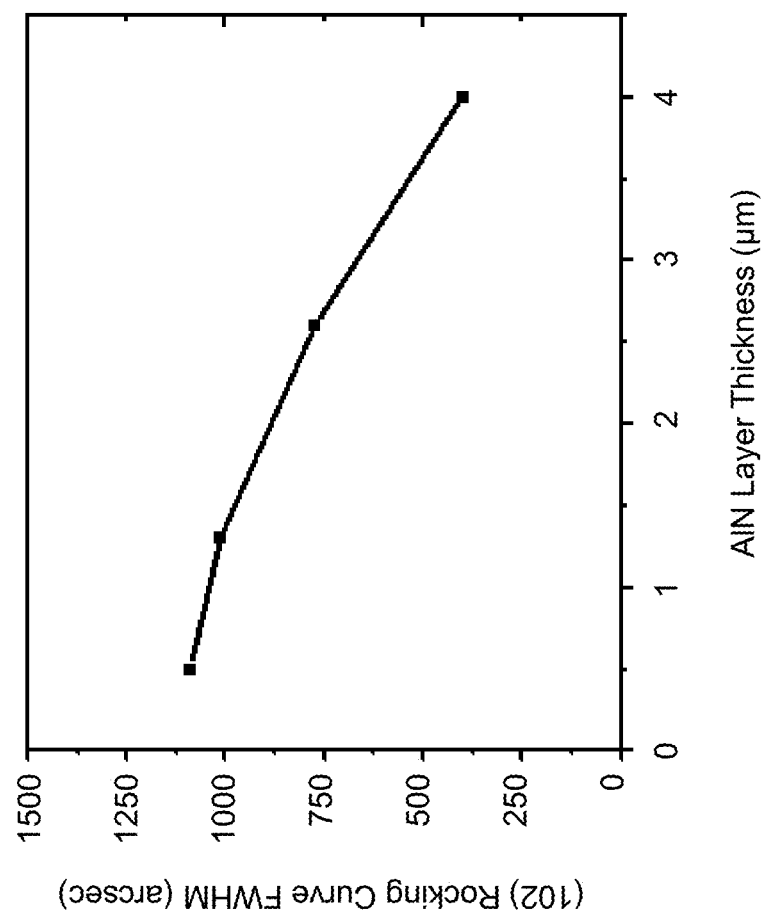
FIG. 6 shows an illustrative plot of a (102) XRD rocking curve FWHM as a function of layer thickness according to an embodiment.

Additionally, analysis of the dislocation density of a layer can include analysis of an X-ray diffraction (XRD) rocking curve, where the full width at half minimum (FWHM) of (102) reflection is related to the dislocation density. To this extent, FIG. 6 shows an illustrative plot of a (102) XRD rocking curve FWHM as a function of layer thickness according to an embodiment. The plot corresponds to an AlN layer grown using strain modulation as described herein. As a illustrated, the AlN (102) XRD rocking curve FWHM is reduced as the layer thickness increases, which indicates a reduction in a density of the edge dislocations.

Figure 7:
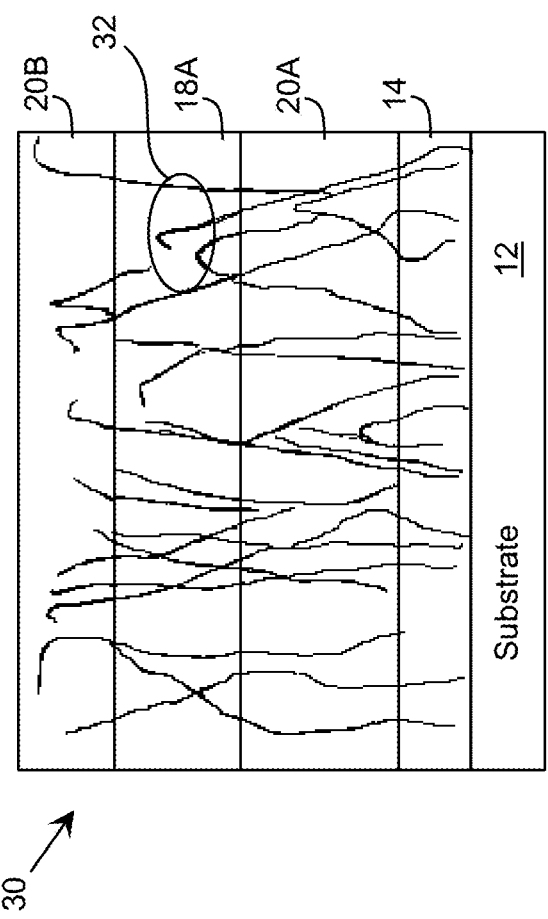
FIG. 7 shows a possible mechanism for the reduction of dislocation density provided by a growth procedure described herein.

FIG. 7 shows a possible mechanism for the reduction of dislocation density provided by a growth procedure described herein. As illustrated, the structure 30 includes a substrate 12, a buffer layer 14, a layer 20A having a tensile stress, a layer 18A having a compressive stress, and a layer 20B having a tensile stress. A series of dislocations can propagate from the substrate 12 into the upper layers. However, as the dislocations propagate, some or all of the dislocations will tend to bend, such as shown in the region 32, due to the tensile and compressive stresses. As a result, a number of threading dislocations present in the upper regions of the structure 30, e.g., in layer 20B, can be significantly reduced from the number propagating from the substrate 12.

In an embodiment, a surface of one or more layers can be patterned, which can be configured to provide an additional relaxation mechanism for reducing cracks and/or threading dislocations in a structure. For example, a surface of the substrate 12 and/or the buffer layer 14 can be patterned, e.g., using etching, masking, a combination of etching and masking, and/or the like. A layer, such as the buffer layer 14 and/or any layer located above the buffer layer, can be grown in multiple steps, one or more of which can include patterning. Such patterning can be achieved by etching and/or masking the layer, masking and subsequent overgrowth, by producing voids during overgrowth process, and/or the like. Regardless, the patterning can be configured to reduce an overall stress accumulated in the corresponding layer structure.

Figure 8B:
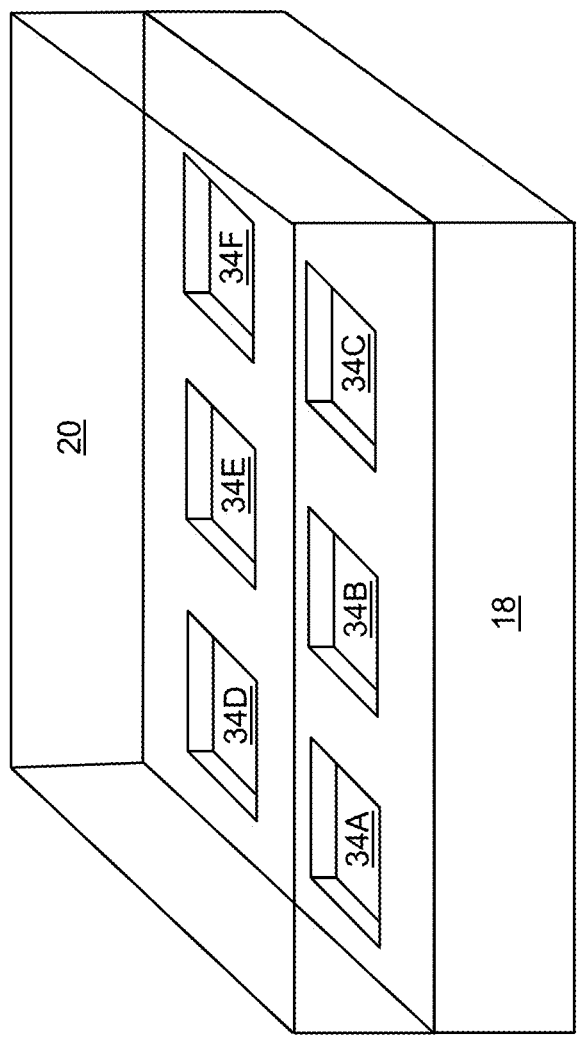

For example, FIGS. 8A and 8B show illustrative patterns of a surface of a compressive layer 18 with a tensile layer 20 grown thereon according to embodiments. In FIG. 8A, the surface of the compressive layer 18 is patterned with a plurality of stripes 32A-32C, while in FIG. 8B, the surface of the compressive layer 18 is patterned with a plurality of windows 34A-34F. However, it is understood that the stripe/window patterns are only illustrative of various patterns that can be utilized. Furthermore, it is understood that similar patterns can be formed on a surface of a substrate 12, a buffer layer 14, and/or a tensile layer 20 prior to the growth of a subsequent layer thereon. Regardless, each pattern can produce an interface where the layers 18, 20 have a common boundary in both a vertical direction of growth and in a lateral direction of the layer.

Figure 9A:
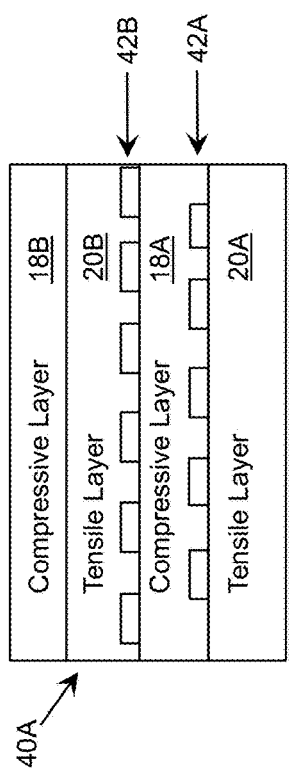
FIGS. 9A and 9B show illustrative patterning arrangements according to embodiments.
Figure 9B:
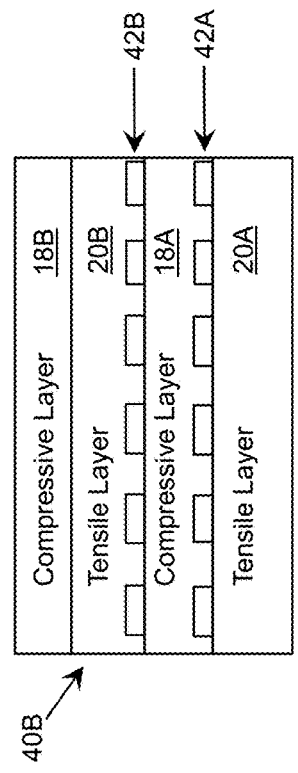

When patterning is employed on the surfaces of multiple layers, the relative positioning of the patterning elements and/or the patterns can be varied for the surfaces of adjacent patterned layers. For example, FIGS. 9A and 9B show illustrative patterning arrangements according to embodiments. In FIGS. 9A and 9B, an interface between a tensile layer 20A and a compressive layer 18A has a first pattern 42A, and an interface between the compressive layer 18A and a tensile layer 20B has a second pattern 42B. The patterns 42A, 42B can be formed by plurality of patterning elements, for example, a series of masked domains or voids located at the respective interfaces. However, in the structure 40A, the patterning elements of the patterns 42A, 42B are laterally offset from one another, thereby forming a vertical checkerboard-like formation of the patterning elements. In contrast, in the structure 40B, the patterning elements of the patterns 42A, 42B are positioned at substantially the same lateral locations.

It is understood that a device or a heterostructure used in forming a device including a structure described herein can be fabricated using any solution. For example, a device/heterostructure can be manufactured by obtaining (e.g., forming, preparing, acquiring, and/or the like) a substrate 12, forming (e.g., growing) a buffer layer 14 thereon, and growing a semiconductor heterostructure 16 as described herein. Furthermore, the fabrication can include patterning a surface of the substrate 12, the buffer layer 14, and/or a semiconductor layer as described herein, the deposition and removal of a temporary layer, such as mask layer, the formation of one or more additional layers not shown, and/or the like. Additionally, one or more metal layers, contacts, and/or the like can be formed using any solution. The heterostructure/device also can be attached to a submount via contact pads using any solution.

The patterning of a layer can be performed using any solution. For example, the patterning can include defining a set of regions on a top surface of the layer for etching using, for example, photolithography to apply a photoresist defining the set of regions, or the like. The set of openings having a desired pattern can be formed, e.g., by etching in the set of defined regions of the layer. Subsequently, the photoresist can be removed from the surface. Such a process can be repeated one or more times to form a complete pattern on the layer. The patterning of a layer also can include applying (e.g., depositing) a mask (e.g., silicon dioxide, a carbon based material, or the like) over a second set of regions on the top surface of the layer. When the pattern also includes a set of openings, the second set of regions can be entirely distinct from the locations of the set of openings. Furthermore, as described herein, the formation of a layer can include multiple repetitions of the patterning process. In this case, each repetition can vary from the previous repetition in one or more aspects. For example, a repetition can include both applying a mask and forming openings on a surface, only forming openings, only applying a mask, and/or the like. Additionally, as described herein, the locations of the masked and/or opening portions for a repetition can be vertically offset from the locations of the adjacent repetition.

In an embodiment, the invention provides a method of designing and/or fabricating a circuit that includes one or more of the devices designed and fabricated as described herein. To this extent, FIG. 10 shows an illustrative flow diagram for fabricating a circuit 126 according to an embodiment. Initially, a user can utilize a device design system 110 to generate a device design 112 for a semiconductor device as described herein. The device design 112 can comprise program code, which can be used by a device fabrication system 114 to generate a set of physical devices 116 according to the features defined by the device design 112. Similarly, the device design 112 can be provided to a circuit design system 120 (e.g., as an available component for use in circuits), which a user can utilize to generate a circuit design 122 (e.g., by connecting one or more inputs and outputs to various devices included in a circuit). The circuit design 122 can comprise program code that includes a device designed as described herein. In any event, the circuit design 122 and/or one or more physical devices 116 can be provided to a circuit fabrication system 124, which can generate a physical circuit 126 according to the circuit design 122. The physical circuit 126 can include one or more devices 116 designed as described herein.

In another embodiment, the invention provides a device design system 110 for designing and/or a device fabrication system 114 for fabricating a semiconductor device 116 as described herein. In this case, the system 110, 114 can comprise a general purpose computing device, which is programmed to implement a method of designing and/or fabricating the semiconductor device 116 as described herein. Similarly, an embodiment of the invention provides a circuit design system 120 for designing and/or a circuit fabrication system 124 for fabricating a circuit 126 that includes at least one device 116 designed and/or fabricated as described herein. In this case, the system 120, 124 can comprise a general purpose computing device, which is programmed to implement a method of designing and/or fabricating the circuit 126 including at least one semiconductor device 116 as described herein.

In still another embodiment, the invention provides a computer program fixed in at least one computer-readable medium, which when executed, enables a computer system to implement a method of designing and/or fabricating a semiconductor device as described herein. For example, the computer program can enable the device design system 110 to generate the device design 112 as described herein. To this extent, the computer-readable medium includes program code, which implements some or all of a process described herein when executed by the computer system. It is understood that the term "computer-readable medium" comprises one or more of any type of tangible medium of expression, now known or later developed, from which a stored copy of the program code can be perceived, reproduced, or otherwise communicated by a computing device.

In another embodiment, the invention provides a method of providing a copy of program code, which implements some or all of a process described herein when executed by a computer system. In this case, a computer system can process a copy of the program code to generate and transmit, for reception at a second, distinct location, a set of data signals that has one or more of its characteristics set and/or changed in such a manner as to encode a copy of the program code in the set of data signals. Similarly, an embodiment of the invention provides a method of acquiring a copy of program code that implements some or all of a process described herein, which includes a computer system receiving the set of data signals described herein, and translating the set of data signals into a copy of the computer program fixed in at least one computer-readable medium. In either case, the set of data signals can be transmitted/received using any type of communications link.

In still another embodiment, the invention provides a method of generating a device design system 110 for designing and/or a device fabrication system 114 for fabricating a semiconductor device as described herein. In this case, a computer system can be obtained (e.g., created, maintained, made available, etc.) and one or more components for performing a process described herein can be obtained (e.g., created, purchased, used, modified, etc.) and deployed to the computer system. To this extent, the deployment can comprise one or more of: (1) installing program code on a computing device; (2) adding one or more computing and/or I/O devices to the computer system; (3) incorporating and/or modifying the computer system to enable it to perform a process described herein; and/or the like.

The foregoing description of various aspects of the invention has been presented for purposes of illustration and description. It is not intended to be exhaustive or to limit the invention to the precise form disclosed, and obviously, many modifications and variations are possible. Such modifications and variations that may be apparent to an individual in the art are included within the scope of the invention as defined by the accompanying claims.

What is claimed is:

1. A semiconductor heterostructure comprising:
a plurality of semiconductor layers epitaxially grown over a substrate, the plurality of semiconductor layers including a set of periods, each period including:
   a first semiconductor layer, wherein the first semiconductor layer is grown using a first molar ratio of group V precursors to group III precursors (first V/III ratio) causing a first stress being one of: a tensile stress or a compressive stress; and
   a second semiconductor layer located over the first semiconductor layer, wherein the second semiconductor layer is grown using a second molar ratio of group V precursors to group III precursors (second V/III ratio) causing a second stress being the other of: the tensile stress or the compressive stress, wherein at least one of the first stress or the second stress is graded.

2. The heterostructure of claim 1, wherein each period further includes a first transitional layer located between the first semiconductor layer and the second semiconductor layer, wherein the first transitional layer includes a region having substantially no tensile or compressive stress.

3. The heterostructure of claim 2, further comprising a second transitional layer located between each period.

4. The heterostructure of claim 3, wherein the second V/III ratio varies continuously in the transitional layer.

5. The heterostructure of claim 1, wherein the first and second V/III ratios vary continuously in the first semiconductor layer and the second semiconductor layer.

6. The heterostructure of claim 1, wherein the first and second V/III ratios are constant in the first and second semiconductor layers.

7. The heterostructure of claim 1, wherein the first V/III ratio in the first transitional layer varies in a first direction and the second V/III ratio in the second transitional layer varies in a second direction opposite of the first direction.

8. The heterostructure of claim 3, wherein a semiconductor composition varies in the first and second transitional layers.

9. The heterostructure of claim 1, further comprising a composite layer located between the first semiconductor layer and the second semiconductor layer, wherein the composite layer includes a plurality of interlayers, wherein an interlayer in the plurality of interlayers located in a portion of the composite layer that is closer to the tensile stress includes a higher Al molar fraction and an interlayer in the plurality of interlayers located in a portion of the composite layer that is closer to the compressive stress includes a higher Ga molar fraction.

10. The heterostructure of claim 1, wherein a thickness of each of the first semiconductor layer and the second semiconductor layer is greater than a critical thickness to avoid pseudomorphic growth.

11. The heterostructure of claim 1, wherein the first semiconductor layer and the second semiconductor layer are formed of group III nitride materials.

12. The heterostructure of claim 1, wherein a composition of the first semiconductor layer and a composition of the second semiconductor layer differ by no more than approximately five percent.

13. A semiconductor structure including:
a substrate; and
a plurality of semiconductor layers on the substrate, the plurality of semiconductor layers including a set of periods, each period including:
a first semiconductor layer, wherein the first semiconductor layer has a first stress being one of: a tensile stress or a compressive stress; and
a second semiconductor layer directly on the first semiconductor layer, wherein the second semiconductor layer has a second stress being the other of: the tensile stress or the compressive stress, wherein at least one of the first or second stress is graded.

14. The structure of claim 13, further comprising a buffer layer located between the substrate and the plurality of semiconductor layers.

15. The structure of claim 14, wherein the buffer layer has a thickness up to approximately two thousand nanometers.

16. The structure of claim 13, each period further comprising a first transitional layer located between the first semiconductor layer and the second semiconductor layer, wherein the first transitional layer includes a region having substantially no tensile or compressive stress.

17. The structure of claim 16, further comprising a second transitional layer located between each period, wherein a V/III ratio varies continuously in the first and second transitional layers.

18. The structure of claim 17, wherein a V/III ratio varies continuously in the first and second semiconductor layers.

19. The structure of claim 17, wherein the V/III ratio remains constant in the first and second semiconductor layers.

20. A method of fabricating a semiconductor structure, the method comprising:
growing a plurality of group III nitride semiconductor layers over a substrate using a set of epitaxial growth periods, wherein each epitaxial growth period includes:
epitaxially growing a first group III nitride semiconductor layer having a first stress being one of: a tensile stress or a compressive stress; and
epitaxially growing a second group III nitride semiconductor layer having a second stress being the other of: the tensile stress or the compressive stress directly on the first semiconductor layer, wherein the epitaxially growing the first semiconductor layer and the epitaxially growing the second semiconductor layer use molar ratios of group V precursors to group III precursors that differ by at least ten percent, and wherein at least one of the first or second stresses is graded.

* * * * *